US007005941B2

(12) United States Patent
Bremond et al.

(10) Patent No.: US 7,005,941 B2

(45) Date of Patent: Feb. 28, 2006

(54) HIGH-FREQUENCY COUPLER

(75) Inventors: André Bremond, Veretz (FR); François Dupont, Tours (FR)

(73) Assignee: STMicroelectronics S.A., Montrouge (FR)

(*) Notice: Subject to any disclaimer, the term of this patent is extended or adjusted under 35 U.S.C. 154(b) by 415 days.

(21) Appl. No.: 10/444,197

(22) Filed: May 23, 2003

(65) Prior Publication Data

US 2003/0224753 A1 Dec. 4, 2003

(30) Foreign Application Priority Data

May 28, 2002 (FR) .................................. 02 06525

(51) Int. Cl.
*H04B 17/00* (2006.01)
*H04B 1/04* (2006.01)

(52) U.S. Cl. .................. 333/109; 455/115.1; 455/125; 455/127.1; 455/129; 333/24 R

(58) Field of Classification Search ............ 455/114.3, 455/115.1, 117–119, 126, 127.1, 129; 333/109, 333/24 R See application file for complete search history.

(56) References Cited

U.S. PATENT DOCUMENTS 4,181,889 A * 1/1980 Davis et al. ................ 455/108
5,530,922 A * 6/1996 Nagode ...................... 455/126
5,673,001 A * 9/1997 Kim et al. .................. 330/284
5,832,373 A * 11/1998 Nakanishi et al. .......... 455/126
5,852,770 A * 12/1998 Kasamatsu .................. 455/126
6,150,898 A * 11/2000 Kushitani et al. ........... 333/110
6,282,265 B1 8/2001 Lowell et al.
6,298,223 B1 * 10/2001 Seow ......................... 455/129
6,603,960 B1 * 8/2003 Oida et al. ............... 455/115.3

FOREIGN PATENT DOCUMENTS

EP 1 168 604 A 8/2001
JP 10056339 A 2/1998

OTHER PUBLICATIONS

French Search Report from French priority application No. 0206525, filed May 28, 2002.

* cited by examiner

*Primary Examiner*—Simon Nguyen
(74) *Attorney, Agent, or Firm*—Lisa K. Jorgenson; James H. Morris; Wolf, Greenfield & Sacks, P.C.

(57) ABSTRACT

A high-frequency coupler for extracting a secondary signal representative of a main signal carried by a conductive line, including two series-coupled, respectively high-pass and low-pass, filters, and the input of which is intended to be connected to said line while its output is intended to provide the secondary signal, the filters being sized so that the sum of their respective attenuations is substantially constant over the coupler passband, and so that their respective cut-off frequencies are in said passband.

11 Claims, 2 Drawing Sheets

HIGH-FREQUENCY COUPLER

BACKGROUND OF THE INVENTION

1. Field of the Invention

The present invention relates to high-frequency couplers which are interposed between a power amplifier and an antenna in a radiofrequency transmission chain. Such couplers are used to extract a portion of the signal transmitted to the antenna to, for example, measure its amplitude and accordingly adapt the amplifier gain.

2. Discussion of the Related Art

FIG. 1 partially and schematically shows a conventional example of a radiofrequency transmission circuit comprising a coupler 1 of the type to which the present invention applies.

The transmit circuit is generally contained in a circuit or radiofrequency front end transmit-receive circuit comprising a receive chain and a transmit chain from a same antenna 2. In FIG. 1, only the transmit circuit is considered, a separator (not shown) being generally provided at the input of antenna 2 to make out the transmitted signals from the received signals.

A radiofrequency signal (RF) carried by a frequency in a predefined band is applied to the input of a power amplifier 3 (PA), the output of which is connected to antenna 2. Coupler 1 is interposed between amplifier 3 and antenna 2 to sample a signal proportional to the transmitted signal. The signal extracted by coupler 1 is, for example, provided at the input of a detector 4 (DET), generally a peak value or mean value detector, in charge of measuring the signal intensity. An output of detector 4 is combined (comparator 5) with a required power threshold LV to provide a level control signal DV to amplifier 3. Coupler 1, detector 4 and comparator 5 form a loop for controlling the power of the transmit amplifier by reference LV.

Reference LV may, depending on the application, be predetermined or be provided by circuits external to the transmit-receive system. For example, in an application to mobile telephony, the required power level is generally provided upon completion of the communication, then periodically, by a beacon to which the unit is connected. In fact, upon completion of a communication, the transmit circuit transmits at full power. This power is measured by the beacon receiving the signals, which in turns transmits, for the phone, a power reference value for the rest of the communication.

FIG. 2 schematically shows a conventional structure of a coupler 1 used in a transmit chain such as illustrated in FIG. 1. Said coupler is an electromagnetic coupler using two tracks 6 and 7 generally patterned on a printed or integrated circuit and coupled to each other. One end of a first track 6 is connected to the output of amplifier 3 while another end 8 is intended to be connected to antenna 2 (generally via the band separator). A second track 7 has a first end connected to the input of detector 4 and a second end connected to ground, generally by a resistor R. The shape given to track 6 within coupler 1 is, in plane view, that of an arch or arches inside of which is housed, in parallel sections, second track 7. The running of a signal in first track 6 generates, by induction, a proportional signal in second track 7. This signal can then be measured by detector 4.

A disadvantage of an inductive coupler such as illustrated in FIG. 2 is that it is frequency-selective. Indeed, the coupler is sized according to the frequencies that it must be able to extract. In practice, in an application to phone, this results in having to provide a coupler for the so-called DCS or PCS band around 1800 MHz and a coupler for the so-called GSM band around 900 MHz. The use of two couplers adversely affects the desired miniaturization of radiofrequency transmit systems. In practice, given the used frequencies, the tracks of an inductive coupler have several centimeters (for example, on the order of 3 cm) of expanded length. Further, if the surface area taken up by the coupler is desired to be reduced, a problem of thickness of the coupler tracks arises.

SUMMARY OF THE INVENTION

The present invention aims at providing an integrated high-frequency coupler which overcomes the disadvantages of conventional couplers.

The present invention more specifically aims at providing a high-frequency coupler having a reduced surface bulk with respect to an induction coupler.

The present invention also aims at avoiding for this surface area reduction to translate as a thickness increase of the circuit containing the coupler.

The present invention also aims at providing a wide-band coupler.

In an example of application to mobile telephony, the present invention especially aims at providing a coupler which can operate in the entire used frequency range.

To achieve these and other objects, the present invention provides a high-frequency coupler for extracting a secondary signal representative of a main signal carried by a conductive line, comprising two series-coupled, respectively high-pass and low-pass, filters, the input of which is intended to be connected to said line while its output is intended to provide the secondary signal, the filters being sized so that the sum of their respective attenuations is substantially constant over the coupler passband, and so that their respective cut-off frequencies are within said passband.

According to an embodiment of the present invention, the sum of the respective attenuations of the filters is constant, plus or minus 10% on the coupler passband.

According to an embodiment of the present invention, the coupling is of capacitive type.

According to an embodiment of the present invention, the high-pass filter has its input connected to the coupler input.

According to an embodiment of the present invention, each filter comprises a single inductive and capacitive cell.

According to an embodiment of the present invention, the coupler is formed as an integrated circuit.

According to an embodiment of the present invention, the high-pass filter comprises a capacitor having a value comprised between 0.1 picofarad and 50 picofarads and an inductance having a value comprised between 0.1 nanohenry and 50 nanohenries.

According to an embodiment of the present invention, the low-pass filter comprises a capacitor with a value comprised between 10 femtofarads and 100 picofarads and an inductance with a value comprised between 0.1 nanohenry and 50 nanohenries.

According to an embodiment of the present invention, the coupler is applied to the extraction of a signal for controlling a power amplifier of a radiofrequency transmission circuit.

The present invention also aims at a wideband radiofrequency transmission circuit comprising, between a transmit amplifier and an antenna, a coupler such as hereabove.

The present invention also aims at a portable phone comprising a circuit such as hereabove.

The foregoing objects, features, and advantages of the present invention, will be discussed in detail in the following non-limiting description of specific embodiments in connection with the accompanying drawings.

DETAILED DESCRIPTION

Figure 1:
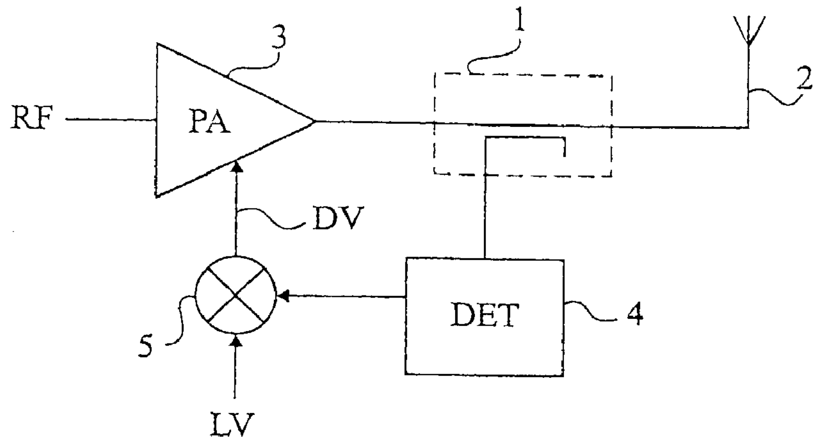
FIG. 1, previously described, shows a conventional example of a transmit circuit of the type to which the present invention applies.
Figure 2:
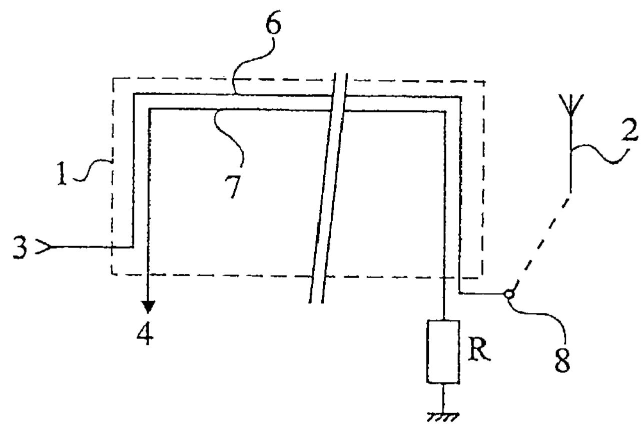
FIG. 2 illustrates the practical implementation of a conventional inductive coupler.

The same elements have been designated with the same references in the different drawings. For clarity, only those components of the transmission circuit which are necessary to the understanding of the present invention have been shown in the drawings and will be described hereafter. In particular, the upstream circuits of a transmission power amplifier have not been illustrated. The present invention applies whatever the transmission chain provided upstream of the power amplifier and of the associated coupler. Similarly, the circuits of exploitation of the measurements performed by a coupler according to the present invention have not been described in detail and can be deduced from conventionally-used detection circuits. The present invention applies to any use of a coupler.

A feature of the present invention is to form a coupler by means of two structures of respective high-pass and low-pass filters sized to obtain a widened frequency response which is as constant as possible.

Figure 3:
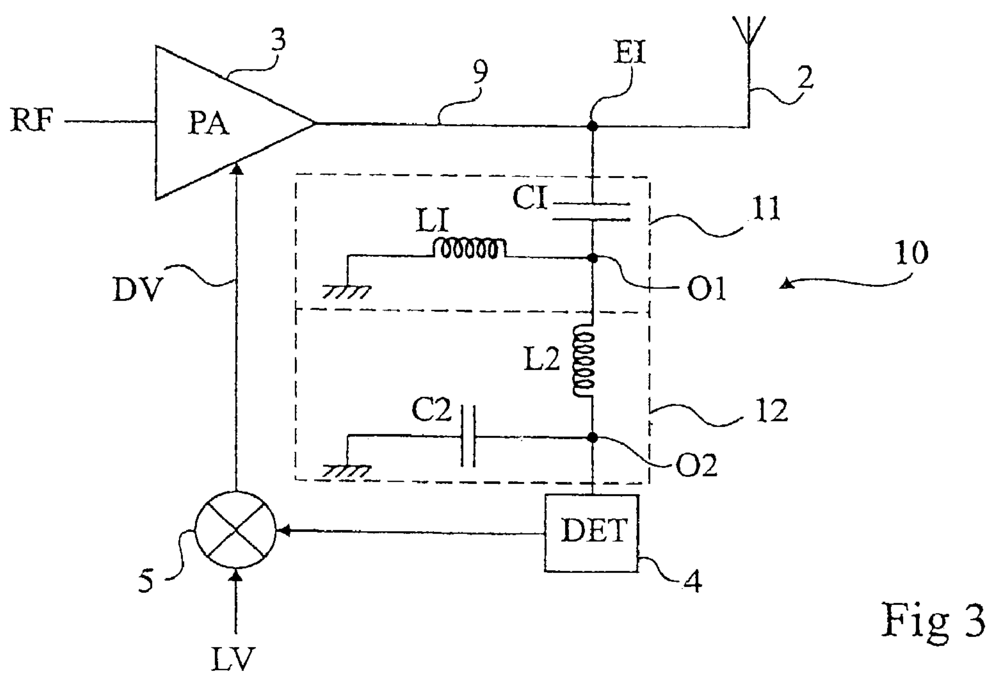
FIG. 3 very schematically shows a transmit circuit according to an embodiment of the present invention.

FIG. 3 shows in a simplified view an embodiment of a coupler 10 according to the present invention, integrated in a radiofrequency transmission circuit.

A power amplifier 3 (PA) receives a radiofrequency signal RF to be transmitted and its output is connected to a transmit antenna 2 (possibly via a band separator). Amplifier 3 is controlled by a power setting signal DV provided by a comparator 5 between a reference level LV and a measured level provided, in this example, by a peak value or mean value detector 4 (DET). Up to this point, the transmission circuit uses the components of a conventional circuit.

According to the present invention, coupler 10 comprises a first high-pass filtering structure 11 followed by a second low-pass filtering structure 12. Structures 11 and 12 are inductive and capacitive structures each formed at least of one filtering cell, that is, of a capacitor and of an inductance.

In the example of FIG. 3, high-pass filtering structure 11 is formed of a capacitor C1 and of an inductance L1. Inductance L1 is connected between the ground and an output terminal O1 of filter 11. Capacitor C1 is connected between an input terminal E1 of filter 11 and terminal O1, terminal E1 being connected to line 9 connecting amplifier 3 to antenna 2.

Low-pass filtering structure 12 is formed of an inductance L2 and of a capacitor C2. Inductance L2 is connected between output terminal O1 of filter 11 and an output terminal O2 of low-pass structure 12, connected to the input of detector 4. Capacitor C2 is connected between terminal O2 and the ground.

According to the present invention, the two structures are connected in series and high-pass structure 11 is connected on the side of line 9 of connection of amplifier 3 to antenna 2, to benefit from a capacitive coupling by capacitor C1.

The values of the components of structures 11 and 12 will be chosen, according to the desired passband, so that:

- the sum of the respective attenuations of the high-pass and low-pass filters (providing the attenuation of coupler 10) is substantially constant in the desired passband; and
- the respective cut-off frequencies (frequencies for which the attenuation is −20 dB) of the high-pass and low-pass filters are located in this passband, to obtained crossed frequency responses.

"Substantially constant attenuation" is used to designate preferably a constant attenuation plus or minus 10%.

Figure 4:
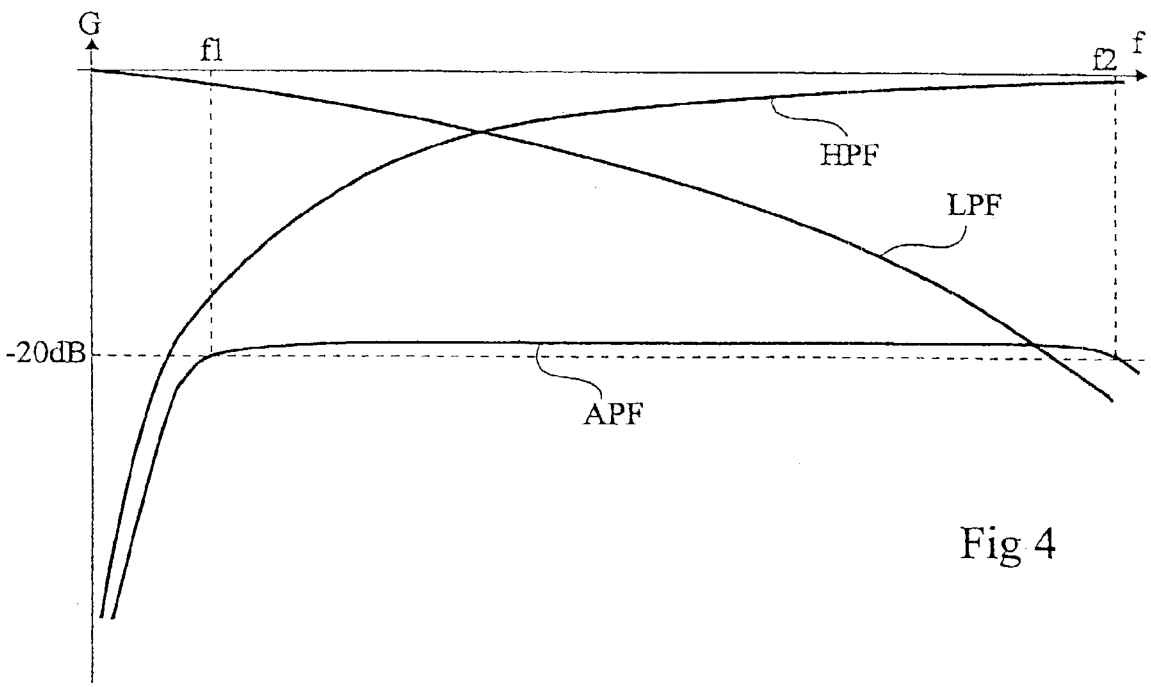
FIG. 4 illustrates in a curve representing the gain versus frequency the operation of the coupler of FIG. 3.

FIG. 4 illustrates by characteristic of a gain G versus frequency f, the respective responses of structures 11 and 12 of FIG. 3 to obtain a coupler according to the present invention. A passband of the coupler (APF) comprised between frequencies f1 and f2 is for example considered. In the example shown, the respective cut-off frequencies of the low-pass and high-pass filters (LPF and HPF) are located outside of the coupler passband. This is however not compulsory.

As illustrated in FIG. 4, curve APF resulting from the association of structures 11 and 12 is substantially constant between frequencies f1 and f2.

Preferably, the widest possible passband is searched to obtain, in a way, an all-pass filter with a steady response.

According to the present invention, the high-pass filter that constitutes the coupler is chosen to have relatively high insertion losses since the signal to be provided by the coupler is a signal proportional to, but of much smaller power than the signal transmitted to the antenna. This filtering characteristic is opposite to what is generally searched for filtering. This choice contributes to reducing losses in the transmit structure. However, the coupling, and thus the insertion losses, of the high-pass structure must be compatible with the obtaining of an exploitable signal, that is, a signal readable by detector 4. For example, a resulting signal (APF) attenuated by on the order of from −15 to −20 dB with respect to the signal provided to the antenna is desired to be obtained. The choice of the attenuation is a compromise between the sensitivity of detector 4 and a will to avoid disturbing the transmission by too large a signal sampling.

According to an alternative embodiment, several filtering structures are provided for the respective high-pass and/or low-pass structures. The multiplication of the number of cells enables obtaining a flatter response of the coupler, at the cost, however, of a slightly greater bulk.

An advantage of the present invention is that it considerably decreases the bulk of a coupler with respect to a conventional electromagnetic coupler. In particular, considering again the example of application to a multiband mobile phone, the present invention provides a space gain, even when providing one coupler per frequency band.

Another advantage of the present invention is, in relation with the application to mobile phones, to enable use of a single multi-band coupler due to the wide frequency band (and thus to the low selectivity) of the coupler of the present invention.

To obtain this result, advantage is taken from the fact that the system operates at high frequencies (several tens of MHz), which enables use of inductances L1 and L2 of relatively small values, and thus of small bulk.

As a specific example of realization, three possible sizings for three different passband of a coupler according to the present invention will be disclosed hereafter.

Example 1, passband between 200 and 800 MHz:

L1=19.5 nanohenries,

C1=6 picofarads,

L2=10.2 nanohenries, and

C2=39 picofarads.

Example 2, passband between 900 MHz and 2.1 GHz:

L1=11.5 nanohenries,

C1=0.5 picofarad,

L2=0.9 nanohenries, and

C2=3.6 picofarads.

Example 3, passband between 3 and 5 GHz:

L1=1 nanohenries,

C1=18 picofarads,

L2=9.8 nanohenries, and

C2=120 femtofarads.

Figure 5:
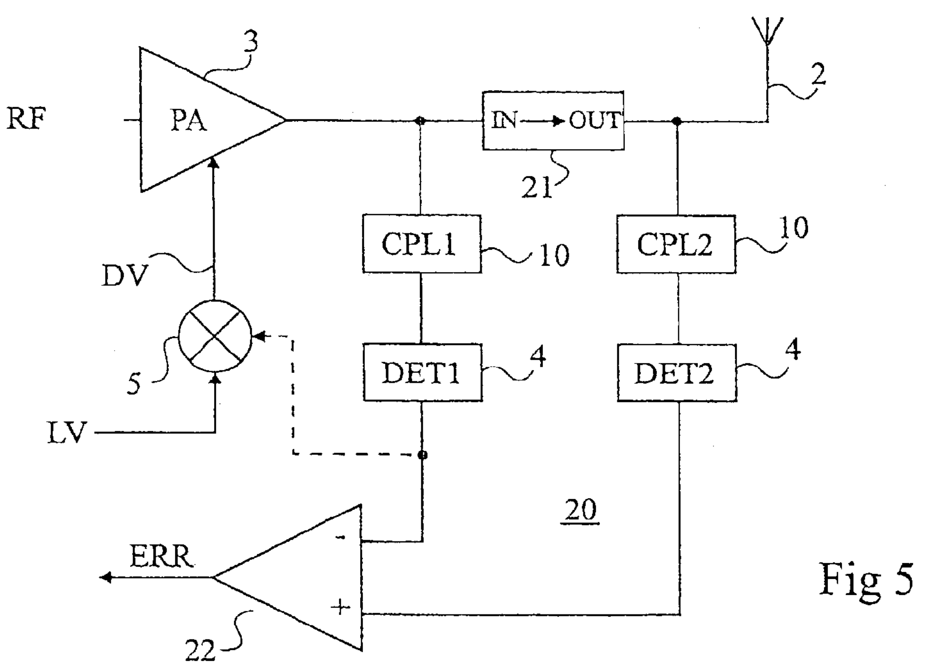
FIG. 5 shows, in the form of blocks, an example of application of the coupler of the present invention to a detection of the tuning of the antenna of a radiofrequency transmission circuit.

FIG. 5 shows an example of application of the present invention to a reflected power detection in a transmission circuit. Such an application enables obtaining an information about the tuning of antenna 2 at the considered transmit frequency. In the diagram of FIG. 5, a tuning detection circuit 20 according to the present invention has only been interposed in a diagram similar to that of FIG. 3. It should be noted that in practice, circuit 20 is not necessarily directly connected to the output of amplifier 3 and to the input of antenna 2. This is why these connections have been represented by dotted lines. In particular, on the side of antenna 2, a tuning circuit of a settable band selector (for example controlled according to the results of the detection performed by circuit 20) will generally be found.

Circuit 20 comprises, according to this embodiment of the present invention, two couplers 10 (CPL1, CPL2) such as described in relation with FIG. 3 in series with two detectors 4 (DET1, DET2) and a unidirectional isolation circuit 21 formed, for example, of magnetic components.

A first coupler CPL1 has its input connected to the input of isolator 21, that is, to the output of amplifier 3. A second coupler CPL2 has its input connected to the output of isolator 21, that is, on the side of antenna 2. The respective outputs of couplers CPL1 and CPL2 are connected (after rectification by detectors 4) to the respective inputs of an operational amplifier 22, the output of which provides a signal ERR of possible detuning of antenna 2.

If the rectified output voltage of coupler CPL2 is different from the rectified voltage at the output of coupler CPL1, this means that there is a tuning problem between the antenna and the frequency of the transmitted signal. Such a circuit 20 thus enables detection, in a particularly simple way, of a detuning of the antenna.

It should be noted that in case of use of a circuit 21 such as illustrated in FIG. 5, one of the two couplers (for example, coupler CPL1) may also be used to control the power of amplifier 3. In this case (illustrated by a connection in dotted lines), the output of detector DET1 is connected to a comparator 5 receiving a level set point LV providing control signal DV to amplifier 3.

Of course, the present invention is likely to have various alterations, modifications, and improvements which will readily occur to those skilled in the art. In particular, the respective sizing of the high-pass and low-pass structures constitutive of a coupler according to the present invention are within the abilities of those skilled in the art based on the functional indications given hereabove. Preferably, the respective values of the capacitances and inductances range between the following limits:

C1 between 0.1 and 50 picofarads;

C2 between 10 femtofarads and 100 picofarads; and

L1 and L2 between 0.1 and 50 nanohenries.

Further, the exploitation of the signals provided by a coupler according to the present invention, be it to control a power amplifier, to detect a detuning, or for another conventional purpose, is within the abilities of those skilled in the art.

Moreover, it should be noted that although the present invention has been more specifically described in relation with an application to mobile telephony and to the tuning of a power amplifier of a transmission circuit, it more generally applies as soon as an integrated high-frequency coupler with a wide band is desired to be obtained on a hardware connection conveying a high-frequency signal (frequency greater than 10 MHz). For example, the present invention applies to couplers intended for signals according to standards CDMA or WCDMA.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A high-frequency coupler for extracting a secondary signal representative of a main signal carried by a conductive line, comprising two series-coupled, respectively high-pass and low-pass, filters, the input of which is intended to be connected to said line while its output is intended to provide the secondary signal, the filters being sized so that the sum of their respective attenuations is substantially constant over the coupler passband, and so that their respective cut-off frequencies are within said passband.

2. The coupler of claim 1, wherein the sum of the respective attenuations of the filters is constant, plus or minus 10% on the coupler passband.

3. The coupler of claim 1, wherein the coupling is of capacitive type.

4. The method of claim 3, wherein the input of the high-pass filter is connected to the coupler input.

5. The coupler of claim 1, wherein each filter comprises a single inductive and capacitive cell.

6. The coupler of claim 1, formed as an integrated circuit.

7. The coupler of claim 1, wherein the high-pass filter comprises a capacitor having a value comprised between 0.1 picofarad and 50 picofarads and an inductance having a value comprised between 0.1 nH and 50 nH.

8. The coupler of claim 1, wherein the low-pass filter comprises a capacitor with a value comprised between 10 femtofarads and 100 picofarads and an inductance (L2) with a value comprised between 0.1 nH and 50 nH.

9. The coupler of claim 1, applied to the extraction of a signal for controlling a power amplifier of a radiofrequency transmission circuit.

10. A wideband radiofrequency transmission circuit comprising, between a transmit amplifier and an antenna, the coupler of claim 1.

11. A portable phone comprising the circuit of claim 10.

* * * * *